United States Patent [19]
Bailey

[11] Patent Number: 5,760,588
[45] Date of Patent: Jun. 2, 1998

[54] DUAL RATE THERMOCHROMIC BATTERY TESTER

[75] Inventor: John C. Bailey, Columbia Station, Ohio

[73] Assignee: Eveready Battery Company, Inc., St. Louis, Mo.

[21] Appl. No.: 900,438

[22] Filed: Jul. 25, 1997

[51] Int. Cl.$^6$ .................... G01N 27/416; H01M 10/48
[52] U.S. Cl. .................... 324/435; 324/104; 429/93; 359/273
[58] Field of Search .................... 324/96, 104, 435; 320/48; 340/636; 429/90, 93; 345/87, 88, 89, 104; 359/265, 269, 270, 273

[56] References Cited

U.S. PATENT DOCUMENTS

| | | | |
|---|---|---|---|
| 4,006,414 | 2/1977 | Parker | 324/96 |
| 4,118,112 | 10/1978 | Thornburg | 324/96 |
| 4,371,827 | 2/1983 | Mullersman et al. | 340/636 |
| 4,379,816 | 4/1983 | Mullersman et al. | 429/91 |
| 4,392,102 | 7/1983 | Sugalski et al. | 320/110 |
| 4,421,560 | 12/1983 | Kito et al. | 106/31.2 |
| 4,702,563 | 10/1987 | Parker | 324/104 |
| 4,702,564 | 10/1987 | Parker | 324/104 |
| 4,723,656 | 2/1988 | Kiernan et al. | 324/104 |
| 4,726,661 | 2/1988 | Parker | 324/104 |
| 4,835,475 | 5/1989 | Hanakura et al. | 324/435 |
| 4,835,476 | 5/1989 | Kurosawa | 324/435 |
| 5,015,544 | 5/1991 | Burroughs et al. | 429/93 |
| 5,059,895 | 10/1991 | Cataldi et al. | 324/104 |
| 5,128,616 | 7/1992 | Palmer | 324/435 |
| 5,156,931 | 10/1992 | Burroughs et al. | 429/93 |
| 5,188,231 | 2/1993 | Kivell et al. | 206/705 |
| 5,223,003 | 6/1993 | Tucholski et al. | 429/93 |
| 5,231,356 | 7/1993 | Parker | 324/435 |
| 5,393,618 | 2/1995 | Weiss et al. | 429/80 |
| 5,409,788 | 4/1995 | Weiss et al. | 429/93 |
| 5,418,085 | 5/1995 | Huhndorff et al. | 429/93 |
| 5,418,086 | 5/1995 | Bailey | 429/93 |

(List continued on next page.)

FOREIGN PATENT DOCUMENTS

| | | |
|---|---|---|
| 495636A2 | 7/1992 | European Pat. Off. . |
| 523901 | 1/1993 | European Pat. Off. . |
| 495636A3 | 3/1994 | European Pat. Off. . |
| 450938 | 12/1995 | European Pat. Off. . |
| 3738731 | 5/1988 | Germany . |
| 57-153275 | 9/1982 | Japan . |
| 63-179269 | 7/1988 | Japan . |
| 2-41365 | 3/1990 | Japan . |
| 2-100269 | 4/1990 | Japan . |
| 313379 | 1/1991 | Japan . |
| 43 29384 | 11/1992 | Japan . |
| 43 29385 | 11/1992 | Japan . |
| 8600282A | 9/1987 | Netherlands . |
| 2282697 | 4/1995 | United Kingdom . |

OTHER PUBLICATIONS

Robert Parker, "Solid State RMS Recording Ammeter," Lawrence Livermore Laboratory, University of California, 1972, (Month Unavailable).

Carl M. Lampert et al., "Large–Area Chromogenics: Materials and Devices for Transmittance Control," *SPIE Institutes for Advanced Technologies*, vol. IS 4, 1988, (Month Unavailable).

*Primary Examiner*—Diep N. Do
*Attorney, Agent, or Firm*—Robert W. Welsh

[57] ABSTRACT

The thermochromic battery tester comprises a conductive heating element having one end including at least two switch pads for selective coupling of the conductive heating element to a second terminal of the battery. Each of the switch pads provides a different resistivity for the heating element when pressed, to thereby change the calibration of the tester for different discharge rates. The battery tester further includes discharge rate calibration indicia associated with each of the switch pads for indicating which switch pad to press for proper calibration at a relative rate of discharge. The conductive heating element may have at least a portion thereof made of a variable resistivity material having a resistivity that changes in response to ambient temperature so as to compensate for varying ambient temperatures. Preferably, the variable resistivity material has a resistivity that increases as ambient temperature increases.

15 Claims, 5 Drawing Sheets

U.S. PATENT DOCUMENTS

| | | | |
|---|---|---|---|
| 5,458,992 | 10/1995 | Bailey | 429/93 |
| 5,478,665 | 12/1995 | Burroughs et al. | 324/435 |
| 5,491,420 | 2/1996 | Parker | 324/104 |
| 5,494,496 | 2/1996 | Huhndorff et al. | 29/623.5 |
| 5,525,439 | 6/1996 | Huhndorff et al. | 229/93 |
| 5,538,806 | 7/1996 | Weiss et al. | 429/90 |
| 5,578,390 | 11/1996 | Hughen | 429/93 |
| 5,600,231 | 2/1997 | Parker | 324/435 |
| 5,604,049 | 2/1997 | Weiss et al. | 429/93 |
| 5,610,511 | 3/1997 | Parker | 324/435 |
| 5,626,978 | 5/1997 | Weiss et al. | 429/90 |
| 5,654,640 | 8/1997 | Bailey | 324/435 |
| 5,667,538 | 9/1997 | Bailey | 429/93 |

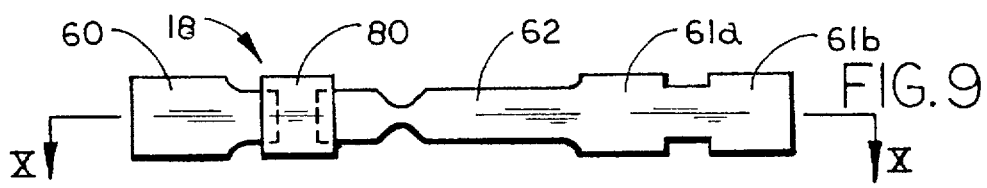
FIG.9
FIG.10
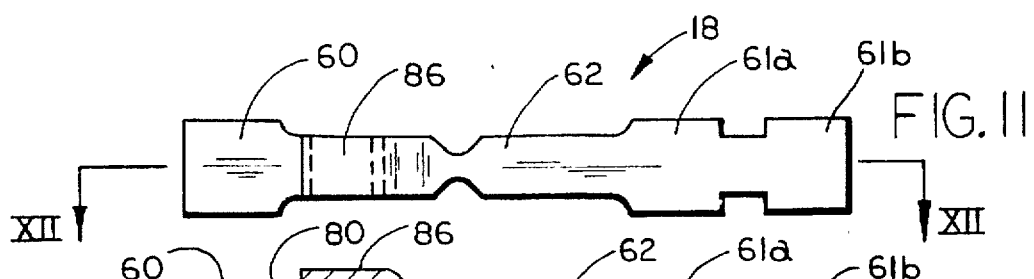
FIG.11
FIG.12
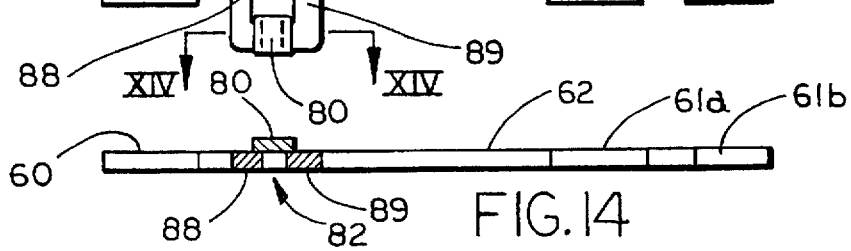
FIG.13
FIG.14
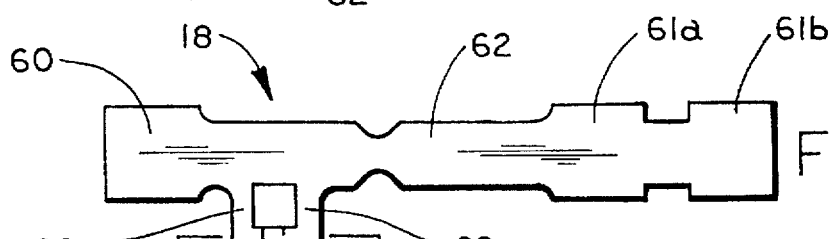
FIG.15
FIG.16

DUAL RATE THERMOCHROMIC BATTERY TESTER

BACKGROUND OF THE INVENTION

The present invention generally pertains to battery testers, and more particularly, relates to on-label thermochromic battery testers.

Batteries are often stored before being used. Batteries are typically stored by retailers before being sold. After purchase by a consumer, such batteries are again typically stored for some period of time prior to use. If the period of storage is significant, batteries may self-discharge. Therefore, it is desirable to utilize a battery tester to determine if a battery has sufficient charge to operate a desired device.

It is also desirable, on frequent occasions, to determine the remaining life of batteries which are in use. Many "good" batteries are discarded simply because the user cannot recall how long they have been used in a particular device, i.e., a camera, tape deck, etc. For similar reasons, batteries often reach a useless or near useless state of discharge when no replacements are readily available. Separate or stand-alone battery testers are known which indicate remaining battery power. However, such testers are easily misplaced and cumbersome to use.

Battery testers have been described that are included in a label secured to a battery. One type of on-label battery tester is known as a "thermochromic battery tester." Thermochromic battery testers typically include a conductive element that is selectively connected between opposite terminals of the battery. The conductive element includes a switch pad at one or both ends that is pressed by the user to connect the conductive element across the terminals of the battery. When the conductive element is connected between the battery terminals, it generates heat as a function of its resistivity and the current flowing from the battery. The level of current produced by the battery is one indicator of the remaining battery capacity. Thermochromic testers further include a thermochromic layer, which changes its color or visual appearance as a function of the heat generated by the conductive element. By changing the visual appearance of the thermochromic layer, a thermochromic on-label battery tester may provide an indication of the discharge level of the battery. For example, a thermochromic material that changes between opaque and transparent states may be utilized to expose indicia underlying the thermochromic layer indicating that the battery is still "good" when a sufficient level of current is output from the battery.

Batteries are used in a variety of applications having widely varying power consumption rates. For example, batteries used to power a camera flash are discharged at a much higher rate than batteries used to power radios, clocks, and flashlights. For those high-rate uses, a higher level of remaining battery capacity is required for the battery to continue to power a high-rate device. Thus, a battery will have been considered to have been fully discharged for such high-rate uses even though the battery would still be considered to be "good" for use in a clock or radio. Thus, a battery tester circuit that is calibrated for a single rate of discharge may not accurately reflect the relative discharge level for use in other applications. For example, if the on-label battery tester is calibrated for high-rate applications (i.e., constructed such that it indicates that the battery is no longer "good" then the battery capacity is not sufficient to recharge a photo-flash unit), then batteries that are still suitable for use in low drain devices, will be needlessly discarded. On the other hand, if the battery tester is calibrated for low-drain devices (i.e., constructed to accurately indicate that a battery is no longer "good" when the cell capacity is insufficient to power a radio or clock), then the indicator may wrongfully suggest that the battery is still "good" when in fact it is not sufficiently "good" to power a high-rate device. This would result in a perception by the consumers that the battery testers are very inaccurate.

The thermochromic materials used in such on-label testers change visual states through a range of predetermined temperatures. Fresh batteries have a higher open circuit voltage and a lower internal resistance and therefore are capable of generating more heat and a greater temperature rise than batteries that have been discharged. If the circuit resistance is appropriately matched to the thermochromic ink transition temperature, the thermal conductivity of the insulation, and the cell electrical characteristics, thermochromic testers are capable of giving valid information about the state of charge of the battery provided that the battery is tested at the temperature used for calibration of the tester circuit. However, if the tester is used in a colder environment, more heat must be generated by the conductive element to change the visual state of the thermochromic material. Likewise, if the tester is used in an environment with relatively high ambient temperatures, the conductive element will have to generate little, if any, heat to cause the thermochromic material to change visual states. For this reason, manufacturers of such thermochromic testers have printed instructions on the battery label to only test the battery at a specified ambient temperature, such as room temperature. Because users will often ignore such instructions and because it may not be possible or convenient for the user to allow the battery to warm up or cool down to the specified temperature, inaccurate discharge level readings are often obtained causing the user to either discard a good battery or to wrongfully believe that a battery is still "good" when it is in fact discharged. Therefore, there exists a need for an on-label thermochromic battery tester that will provide an accurate indication of whether the battery is good regardless of the ambient temperature in which the tester is used.

SUMMARY OF THE INVENTION

Accordingly, an aspect of the invention is to solve the above problems by providing an on-label thermochromic battery tester that provides an accurate indication of the discharge level of the battery regardless of the discharge rate of the device in which the battery is to be used. To achieve this and other aspects and advantages, the battery tester of the present invention comprises a conductive heating element having one end including at least two switch pads for selective coupling of the conductive heating element to a second terminal of the battery. Each of the switch pads provides a different resistivity for the heating element when pressed, to thereby change the calibration of the tester for different discharge rates. The battery tester further includes discharge rate calibration indicia associated with each of the switch pads for indicating which switch pad to press for proper calibration at a relative rate of discharge.

A further aspect of the present invention is to provide a battery tester that not only provides the ability of the user to select the proper calibration for the intended rate of discharge but also provides an accurate indication of the discharge level of the battery regardless of the ambient temperature of the environment in which the battery tester is used. To achieve this and other aspects and advantages, the battery tester of the present invention further includes the conductive heating element having at least a portion thereof made of a variable resistivity material having a resistivity that changes in response to ambient temperature so as to compensate for varying ambient temperatures. Preferably, the variable resistivity material has a resistivity that increases as ambient temperature increases.

The features and advantages of the invention may be realized and obtained by means of the instrumentalities and combinations particularly pointed out in the written description and claims hereof, as well as the appended drawings.

BRIEF DESCRIPTION OF THE DRAWINGS

In the drawings:

FIG. 9 is a top view of a conductive circuit constructed in accordance with a first variation of a second embodiment of the present invention;

FIG. 10 is a cross section of a conductive circuit shown in FIG. 9 taken along plane X—X;

FIG. 11 is a top view of a conductive circuit constructed in accordance with a second variation of the second embodiment of the present invention;

FIG. 12 is a cross section of the conductive circuit shown in FIG. 11 taken along plane XII—XII;

FIG. 13 is a top view of a conductive circuit constructed in accordance with a third variation of a second embodiment of the present invention;

FIG. 14 is a cross section of a conductive circuit shown in FIG. 13 taken along plane XIV—XIV;

FIG. 15 is a top view of a conductive circuit constructed in accordance with a fourth variation of the second embodiment of the present invention; and FIG. 16 is a cross section of the conductive circuit shown in FIG. 15 taken along plane XVI—XVI.

DETAILED DESCRIPTION OF PREFERRED EMBODIMENTS

Figure 1:
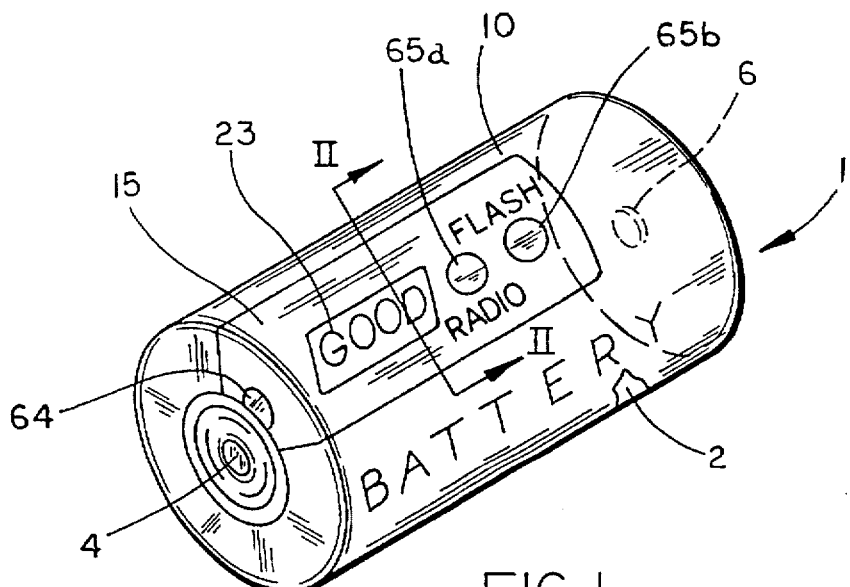
FIG. 1 is an illustration of a battery having a battery tester label in accordance with this invention disposed about the outer periphery of the battery.

FIG. 1 illustrates a battery and label assembly 1 comprising a battery can 2, a negative terminal 4, and a positive terminal 6. Can 2 may be in electrical contact with positive terminal 6. Battery 1 may include one or more electrochemical cells, which may be primary cells or secondary cells. Extending around and attached to the periphery of can 2 is a label 10 including a battery tester device 15, which is the subject of this invention. As shown, tester device 15 comprises switches 64, 65a, and 65b which activate tester 15 to indicate the state of charge of the battery by exposing indicia 23 or producing some other visual indication.

Figure 5:
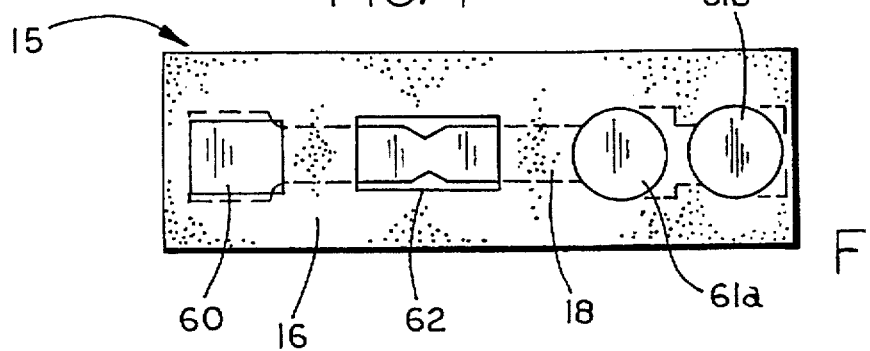
FIG. 5 is a bottom plan view of the inserted tester device, the cross-hatching indicating a layer of adhesive.

As illustrated in FIGS. 2–5, tester device 15 generally comprises a laminate or layered assembly having a substrate layer 20, an elongated electrically conductive circuit 18 disposed on a first face of substrate 20, and a pressure-sensitive adhesive 16 disposed on portions of both conductive circuit 18 and the first face of substrate 20. Adhesive 16, indicated by cross-hatching in FIG. 5, is preferably applied over conductive layer 18 in the pattern illustrated. Adhesive 16 is omitted from those areas which will overlie printed insulation 44 and switch pads 42, 42a, and 42b (FIGS. 6 and 8) when the tester 15 is affixed to a base laminate 30. This adhesive pattern retards moisture from migrating to switch segments 60, 61a, and 61b of conductive circuit 18 while not interfering with the function of either the switches or the insulation discussed below.

Tester device 15 further comprises one or more graphic layers 22, preferably of decorative ink, and indicia 23 that are disposed on a second face of substrate 20 opposite the face containing conductive circuit 18. Tester device 15 also comprises a layer of a temperature sensitive (i.e., thermochromic) indicating material 24 that is deposited upon the second face of substrate 20, preferably upon graphic layers 22 and indicia 23. A layer of a clear protective coating (not shown) is preferably deposited over indicator layer 24 and optionally upon graphic layers 22 and other exposed regions of the second face of substrate 20.

By providing a plurality of switches 65a and 65b on one side of a central display area 62 of conductive circuit 18, the resistance of conductive circuit 18 as presented between the two contacted terminals of the battery, may be selectively varied. With a switch configuration as shown in the drawings, pressing switch 65a would present a lower resistance than if switch 65b were pressed. Battery tester device 15 also preferably includes indicia 90a and 90b printed on the outermost layer of device 15 in association with each of switches 65a and 65b in order to indicate which switch should be pressed for high- or low-rate applications. Because the high-rate discharge application requires greater battery capacity to be considered "good," the resistance of conductive circuit 18 must be greater than that for lower discharge rate applications for proper calibration. Thus, in the examples shown, switch 65a would be used for low-rate devices such as a radio, and switch 65b would be used for high-rate devices such as a photo-flash. As will be explained in more detail below, the second switch may be provided by adding a little additional conductive ink and punching one more hole through the battery label to allow for contact. Thus, the additional feature of providing for two separate calibrations for different discharge rates may be accomplished at very low cost.

Figure 3:
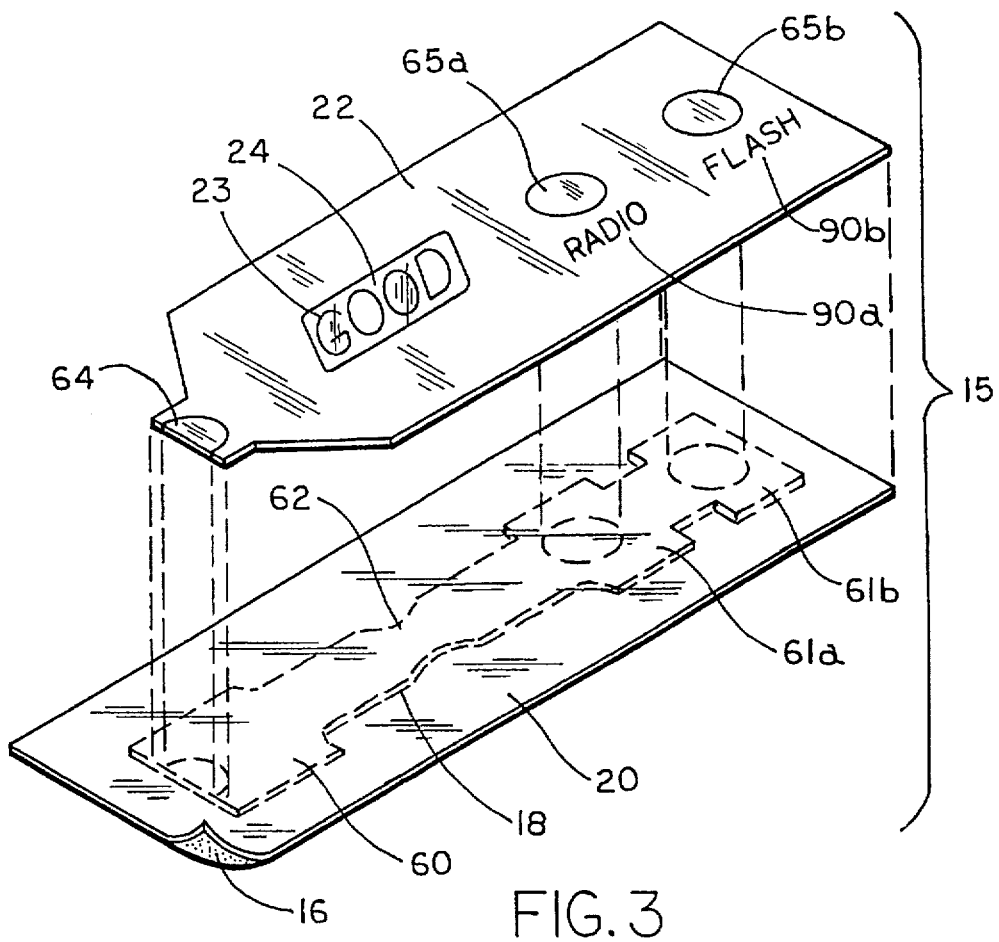
FIG. 3 is an exploded view of a subcomponent of the battery tester label, referred to herein as the tester device.
Figure 4:
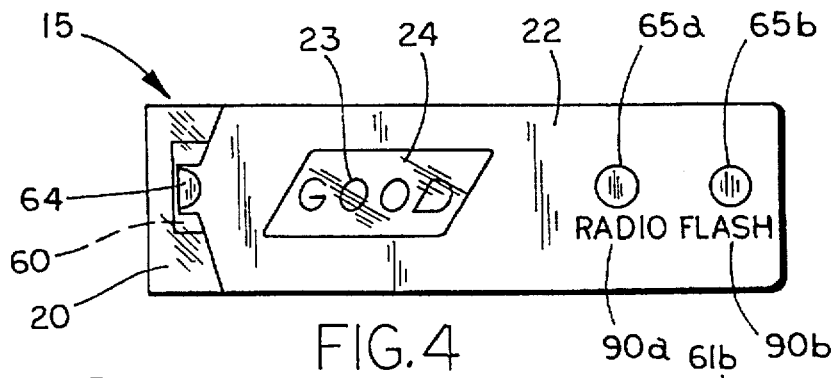
FIG. 4 is a top plan view of the inserted tester device.
Figure 8:
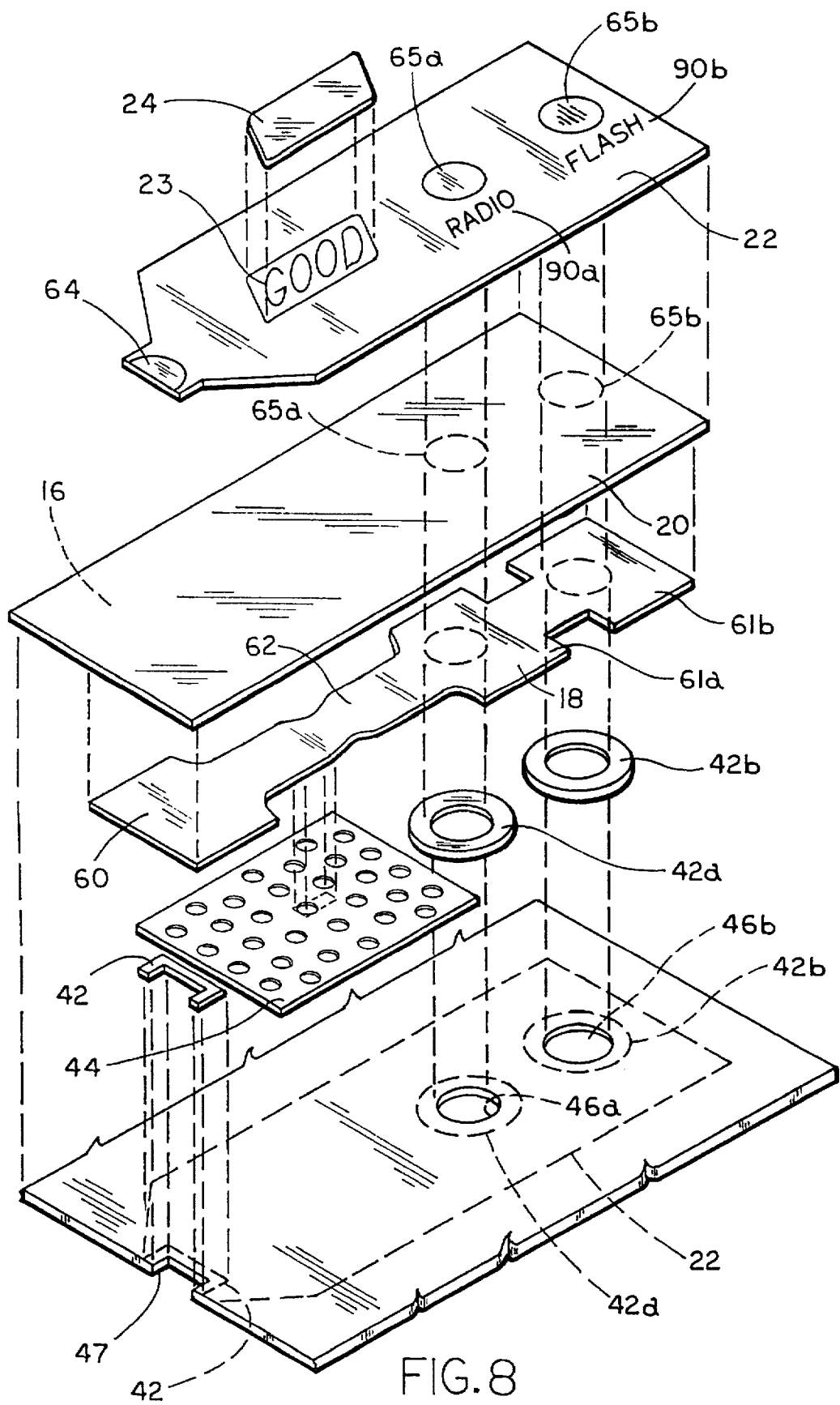
FIG. 8 is an exploded view of the battery tester label.

According to a first embodiment of the present invention, conductive circuit 18, which serves as a heating element, is printed in the pattern as illustrated in FIGS. 3, 5, and 8 using a material having a resistivity that varies as a function of temperature. Such conductive materials preferably have a positive temperature coefficient (PTC) of resistance causing the resistance of conductive circuit 18 to increase with the ambient temperature of the environment in which the tester may be used. Thermistor-type solid state materials may also be used. Given the dimensions typically used for the type of conductive circuit 18 shown in the drawings, for a temperature range of 10° C. to 40° C. (50° F. to 104° F.), the resistivity of conductive circuit 18 will preferably change by a factor of 25. Although silver conductive inks conventionally used for printing such conductive circuits do not exhibit such characteristics, carbon-based compositions exist that may be employed for this purpose to achieve the objectives of the present invention. Examples of such carbon-based compositions include ethylene-ethylacrylate copolymer;

polyolefins and polyolefin-paraffin mixtures, e.g., polyethylene; polyethylene oxide; and nylon 66. An advantage in forming conductive circuit 18 entirely of a single variable resistance material is that conductive circuit 18 may be produced using a single print station.

According to a second embodiment of the present invention, a portion of conductive circuit 18 is formed using a material having a non-variable resistivity and a portion made from a material having a variable resistivity. The portion of conductive circuit 18 that is made of a variable resistivity material may be electrically coupled in series with the other portion of conductive circuit 18 or in parallel, as described below. Preferably, the material used to form the portion of non-variable resistivity is a silver ink and the material used to form the variable resistivity portion is one of the above carbon-based compositions.

FIGS. 9–12 show a conductive circuit of the second embodiment of the present invention with the portion of variable resistance coupled in series with the portion of non-variable resistance. As shown in FIGS. 9 and 10, such a conductive circuit 18 may be formed by printing the non-variable resistivity portion in essentially the same pattern as discussed above with respect to the first embodiment except that a conductive ink is used that has a constant resistivity, and a gap 82 is provided in the deposited layer to electrically isolate switch segments 60, 61a, and 61b. Subsequently, a layer 80 formed of a material having a variable resistivity is printed across gap 82 in contact with edges 84 and 86 of the first printed material that are adjacent gap 82.

An alternative method and construction for a series-coupled conductive circuit 18 according to the second embodiment is illustrated in FIGS. 11 and 12. In this alternative construction, contact portions 84 and 86 of the non-variable resistivity material are overlapping with a layer 80 of variable resistivity material sandwiched therebetween. By providing a layer 80 of variable resistivity material in series with the remaining portion of conductive circuit 18, the total resistance appearing between switch segments 60, 61a, and 61b will be equal to the sum of the resistance of the segments 60, 61a, and 61b and layer 80. Thus, as ambient temperature increases, so will the resistance of layer 80 and the total resistance of conductive circuit 18. This increase in resistance decreases the current flowing through central portion 62 of conductive circuit 18 thereby resulting in less heat being generated by central portion 62 which underlies thermochromic layer 24.

FIGS. 13–16 illustrate the parallel connection approach to the second embodiment of the present invention. To connect the layer 80 of variable resistivity material in parallel with the portion of non-variable resistivity, the latter portion may be printed having first and second legs 88 and 89 extending perpendicularly from an axis between switch segments 60, 61a, and 61b while being provided with a gap 82 therebetween. Subsequently, a layer 80 of variable resistivity material may be printed across gap 82 in series with legs 88 and 89 and in parallel with at least a portion of the non-variable resistivity material of conductive circuit 18. An alternative construction is shown in FIGS. 15 and 16 in which legs 88 and 89 overlap one another with layer 80 of variable resistivity material provided therebetween. Like the series-connected variation of the first embodiment, the parallel connected variation effectively increases the resistance of conductive circuit 18 in response to an increase in ambient temperature.

The tester device 15, as shown in FIGS. 2–5 and 8, is preferably prepared as follows. A plastic film is provided for substrate 20. Although FIG. 3 illustrates substrate 20 as being transparent, substrate 20 could be formed from a wide variety of other materials including opaque and translucent materials. Conductive circuit 18 is deposited on one face of substrate 20. Conductive circuit 18, having the properties discussed above, is preferably deposited in the form of a pattern comprising two distal regions and a medially disposed area 62 which undergoes an increase in temperature upon passage of electrical current. The pressure-sensitive adhesive material 16 is deposited on at least portions of either or both conductive circuit 18 and a face of substrate 20. As previously noted, particular regions of conductive circuit 18 are left exposed and not covered with pressure-sensitive adhesive 16; namely, the switch segments 60, 61a, and 61b and area of controlled resistivity 62. A silicone-coated release liner, such as a silicone-coated paper or plastic film (not shown), is applied onto the previously deposited pressure-sensitive adhesive 16 to facilitate handling and/or storage of tester device 15.

Graphics and/or other labeling colors 22 in the form of a layer or layers of decorative ink and indicia 23 are printed onto the opposite side of substrate 20 from that on which the conductive circuit 18 is positioned. It is preferred that indicia 23 be disposed directly above the area of controlled resistivity 62 of conductive circuit 18 located on the other side of substrate 20. Additional graphics are also preferably printed to designate switch regions 64, 65a, and 65b. If necessary, one or more curing operations may be performed to cure or partially cure the graphic or coloring layers.

On the same side of the substrate as the graphics and/or labeling colors, a thermochromic ink or other indicator material 24 is deposited onto substrate 20 such that it is situated directly above the area of controlled resistivity 62 of conductive circuit 18 and preferably over indicia 23. A clear protective coating, such as a varnish film, is then applied over and onto the indicator material, and optionally over the remaining regions of this side of substrate 20 to protect such regions from damage by subsequent manufacturing or storage operations. Each of the previously-described layers or elements preferably have a thickness of from about 0.00005 inch to about 0.005 inch. The tester device, if necessary, can be cut to an appropriate size.

Figure 2:
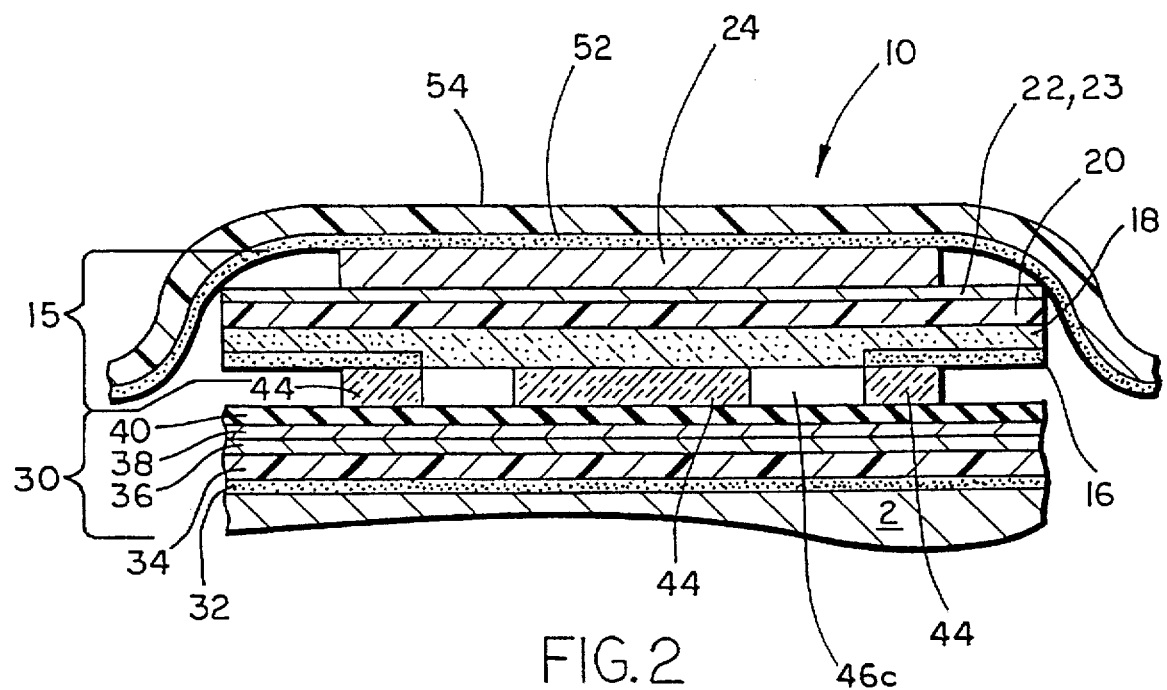
FIG. 2 is a cross section of the battery tester label taken along plane II—II of FIG. 1.
Figure 6:
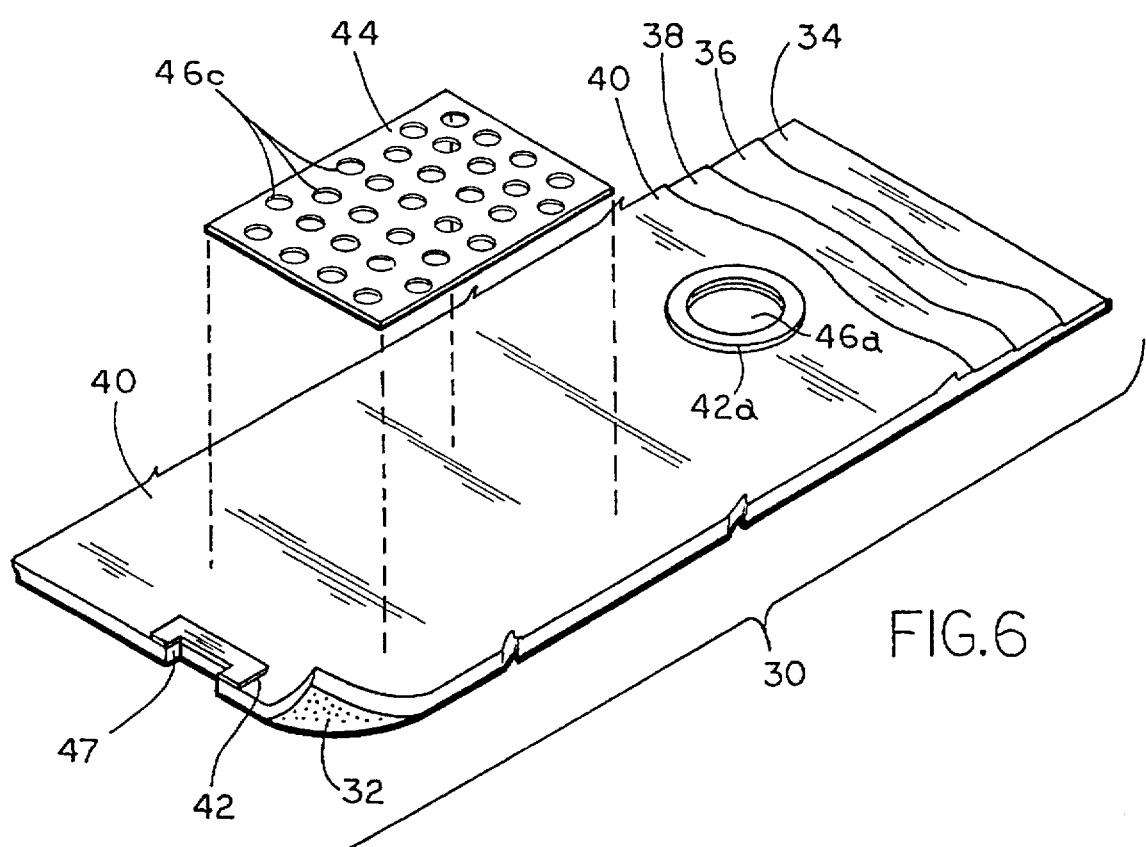
FIG. 6 is an exploded view of another subcomponent of the battery tester label, referred to herein as the base layer.

The second subcomponent of the preferred embodiment label 10 is a base laminate 30. As illustrated in FIGS. 2 and 6, base laminate 30 is a laminate or layered structure comprising a substrate 34, with one face having a layer of pressure-sensitive adhesive 32 for subsequent contact with a battery, and another face having one or more layers as follows: a metallization layer 36; a primer and/or decorative layer 38; an electrical insulation layer 40; and a thermal insulation layer 44. Also residing proximate to the thermal insulation layer are one or more switch throw pads 42 described in greater detail below.

Base laminate 30 is preferably prepared as follows. A plastic film is provided for the base layer substrate 34. The pressure-sensitive adhesive material 32 is deposited upon the face of the base layer substrate 34 that will subsequently face and contact the battery can 2. A silicone release liner is applied on the pressure-sensitive adhesive to facilitate handling and other processing operations. On the opposite face of base layer substrate 34, one or more graphic or labeling color layers are deposited, for instance, by printing. Preferably, metallization layer 36 is utilized to provide a decorative reflective layer. If a metallization layer is deposited, it will in most instances be necessary to deposit a receptive coating or primer layer 38 onto those regions of metallization layer 36 upon which other decorative layers are to be deposited. Primer layer 38 may in itself be a decorative layer. It is also desirable to deposit a layer of electrical insulation 40 upon metallization layer 36 and/or primer layer 38 to prevent electrical contact, i.e., shorting, between layer 36 and the conductive circuit 18 of tester device 15 during assembly of label 10.

Thermal insulation 44 is positioned in an area of base layer substrate 34 that will be disposed beneath the indicator material 24 and the maximum resistance area 62 of conductive circuit 18 of the previously-described tester device 15. This thermal insulation reduces heat transfer from the area of controlled resistivity 62 of conductive circuit 18 to the battery. If such heat transfer is not controlled and the battery is permitted to act as a heat sink, the change in temperature at indicator material 24 may be insufficient to provide an accurate indication of the battery state of charge.

Thermal insulation 44, as shown, preferably comprises a plurality of apertures 46c which, when assembled into the laminate structure of the preferred label 10, provide air pockets which further thermally insulate the conductive circuit 18 from the battery. Optionally, a larger region of air space or void may be formed to serve as insulation by depositing a suitable spacer material onto the base laminate 30. The preferred insulating pattern is a series of islands printed onto laminate 30 in the manner shown in FIG. 1A of U.S. Pat. No. 5,389,458.

Switch throw pads 42a and 42b are also formed surrounding a switch apertures 46a and 46b, respectively. This raised pad provides spacing between switch segments 61a and 61b of the conductive circuit 18 and battery can 2, and significantly minimizes the occurrence of accidental switch closure. Raised switch throw pads 42a and 42b are preferably formed by depositing or printing a dielectric ink or other suitable material. A second switch pad 42 may be formed proximate a switch aperture 47 as shown in FIGS. 6 and 8. This pad has not been found necessary for proper functioning of the tester.

In all of the foregoing operations, one or more cure steps may be utilized when depositing or printing any of the previously-described layers, particularly the decorative inks. Each of the previously-described layers or elements preferably has a thickness from about 0.00005 inch to about 0.005 inch.

Switch apertures 46a, 46b, and 47 are preferably formed in base laminate 30 after printing thermal insulation 44 and switch throw pads 42, 42a, and 42b. Such apertures are preferably formed by suitable punching operations. Registry problems are minimized by printing what is to become switch pads 42a and 42b as a solid disk and thereafter punching apertures 46a and 46b centrally through this disk. Switch apertures are formed in the base laminate 30 so that when the previously-described inserted tester device 15 is combined with base laminate 30, switch apertures 46a, 46b, and 47 are located directly beneath the distal switch segments 60 and 61 of conductive circuit 18. The preferred geometry for such switch apertures is a notch 47 for the negative switch segment 64 and a circle 46a/46b for the positive switch segments 65a and b.

The switches utilized in the battery tester label are preferably membrane switches such that a switch segment 60, 61a, or 61b of conductive circuit 18 overlies apertures 46a, 46b, and 47 in base laminate 30. Apertures 46a, 46b, and 47 in base laminate 30 enable contact between conductive circuit 18 and either a battery terminal or can 2 on the other side of base laminate 30. Upon application of a force to a switch segment, such as by applying finger or thumb pressure at switch segments 64, 65a, or 65b, a portion of the switch segment is pressed or deformed through the opening in base laminate 30 to contact the battery terminal or can 2. Upon release of the pressure, the portion of the switch segment resiliently "springs" away from and, thus, out of electrical contact with the battery terminal or can 2. This configuration is referred to herein as "switchably connected."

A significant advantage provided by the present invention battery tester label is the absence of electrically conductive layers or members to electrically connect and disconnect the tester, i.e., conductive circuit 18, to and from the battery. This is remarkable and of significant benefit particularly when manufacturing a battery tester label in large volumes and at a high rate. This advantage of eliminating otherwise necessary electrically conductive switching components is achieved in part by providing a first switch 64 which is disposed very near a battery terminal, such as negative terminal 4. Such close proximity eliminates the need for additional conductive elements to electrically connect an end of circuit 18 to the negative battery terminal. It is most preferred to fold or shrink the peripheral edge of label 10 over the battery end at which the negative terminal is disposed, as illustrated in FIG. 1.

The tester device 15 is combined with base laminate 30 as follows and as best shown in FIG. 8. The tester device is positioned onto or adjacent base laminate 30 so that switch segments 60, 61a, and 61b of conductive circuit 18 overlie switch apertures 46a, 46b, and 47, respectively. Tester device 15 is oriented such that the layer of pressure-sensitive adhesive 16 (the release liner having been removed if previously applied) is facing base laminate 30. Upon application of sufficient pressure to tester device 15 and base laminate 30, the two assemblies are securely attached to each other via adhesive 16, and form the preferred battery tester label 10 of the present invention. Optionally, a clear laminating adhesive 52 is deposited upon the outward facing surface of the resulting tester label as illustrated in FIG. 2, and a clear film 54, such as polyvinyl chloride or polyester, is applied over the coating and the resulting assembly cured. A coating of adhesive 52 and film 54, when applied onto the tester label, provide protection for the tester device and components thereof. It is most preferred that the transparent protective layer resulting from adhesive coating 52 and film 54 is deposited upon the battery tester label prior to application of the tester label to a battery.

The resulting battery tester label 10 is appropriately die cut to the size of the battery desired. Upon removal of excess trimmed label, a plurality of individual tester labels are left remaining on the release liner previously applied to substrate 34 of base laminate 30. The liner and label array may then be cut into strips and wound into a roll and stored for subsequent application to batteries.

The substrate layer utilized for either or both the base layer substrate 34 and the tester device substrate 20 can be made of any desired dielectric polymer material. It is preferable to use a dielectric polymer material that will shrink when assembled on a battery. Generally, polyvinyl resins, polyolefin resins, polyester resins and the like would be suitable. Specific examples include polyvinyl chloride, polyethylene and polypropylene. It is contemplated that substrate 20 could also be formed from other dielectric materials besides plastics such as paper or other cellulose-based materials. The thickness of the substrate layers is not particularly limited, but is preferably in the range of from about 0.0005 to about 0.005 inch, and most preferably from about 0.001 to about 0.003 inch.

The previously-described indicator layer 24 in the inserted tester device 15 comprises a thermally sensitive material for indicating the capacity of the battery. The preferred thermally sensitive materials change color in response to a temperature change, which change is readily viewable by a consumer. Thus, the consumer, based on the color change, can determine whether the battery is good or needs to be replaced. Examples of such thermally sensitive materials include liquid crystal materials and thermochromic inks. Examples of suitable liquid crystal materials are of the cholesteric type, such as cholesteryl oleate, cholesteryl chloride, cholesteryl caprylate and the like. The indicator material could change from colored to colorless, colorless to colored, or from one color to a second color. A tri-color material could also be used. The preferred battery tester 10 shown in FIGS. 1–8 utilizes an indicating material which changes from colored to colorless upon activation to reveal indicia 23 underneath the indicator material 24.

Indicating materials, such as thermochromic inks, can be used singly or in combination. For example, in one embodiment different layers of the indicating material are employed. The layers are activated at different temperatures or states and can be designed to change different colors at different temperatures. For example, the layer of indicating material activated at the highest temperature will preferably be the bottom layer, i.e., closest to the battery, and the outer layers are arranged in decreasing temperatures of activation with lowest temperature material in the outermost layer, and so, readily viewable at the exterior of the battery.

Any one or all of switch segments 60, 61a, and 61b of conductive circuit 18 can be out of contact with the respective terminals of the battery so that the tester circuit is open. In one embodiment of the invention, one of the switch segment ends is permanently in electrical connection with one terminal of the battery, while the other switch segment ends are positioned out of contact with the other battery terminal. By forcing one of the switch segment ends into contact with the other battery terminal, the switch is closed and the tester circuit is completed to test the battery with respect to the discharge rate selected. The most preferred embodiment is to utilize a dual switch tester as shown in the accompanying drawings.

The labels useful in this invention can also comprise additional electrical and thermal insulative layers, printing layers, protective layers and the like. Suitable materials for use as the different layers are those typically used in battery labels and include plasticized or unplasticized polyvinyl chloride (UPVC), polyesters, metallic films, paper and the like. The tester label can be in the form of a shrinkable tube label in which a battery is encased.

Figure 7:
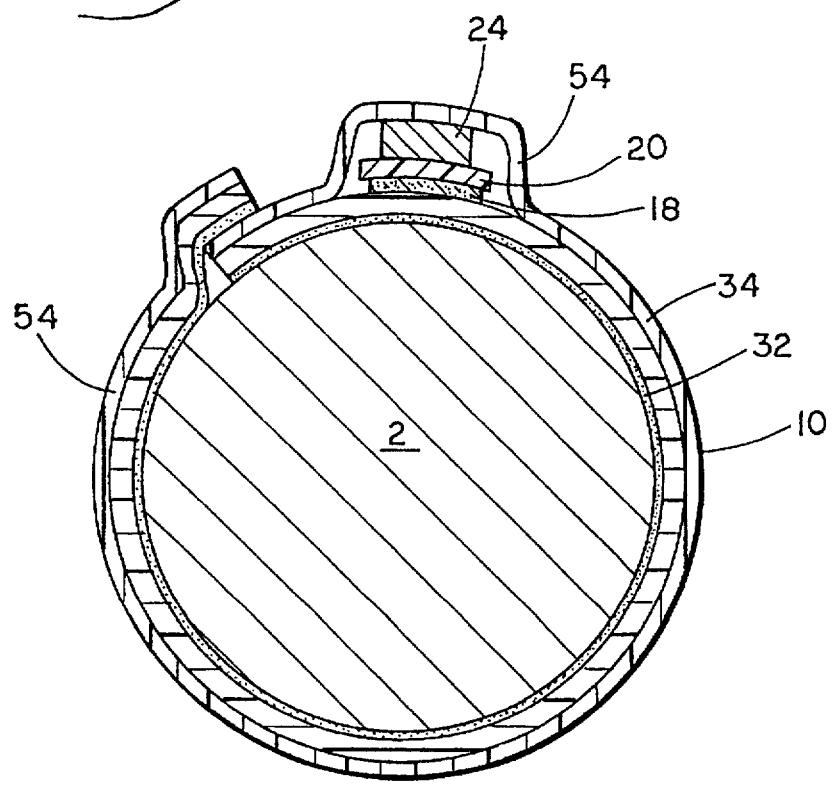
FIG. 7 is a cross section of a battery and the battery tester label.

The battery tester label of the present invention is preferably applied to a battery as follows. A previously assembled tester device 15, having its underside containing pressure-sensitive adhesive 16 exposed, is aligned with a previously formed base laminate 30 (disposed upon a releasable liner) such that the electrically conductive circuit 18 of the inserted tester device is positioned to contact the thermal insulation 44 of base laminate 30. Upon application of sufficient pressure, the respective layers are secured and joined to one another via pressure-sensitive adhesive 16 disposed on the mating surface of tester device 15. The resulting battery tester label 10 is then attached to the outer periphery of a battery can 2 by removing the liner of base laminate 30 to expose adhesive 32 on the underside of label 10 and contacting the underside of base laminate 30 to the battery can 2. FIG. 7 (not to scale) illustrates a typical cross section of the battery and label assembly 1. It is also possible to produce the tester label of the present invention and apply such to a battery without using preassembled tester device and/or base laminate subcomponents. In another embodiment, the battery and tester label assembly is formed by combining the tester device 15 and base laminate 30 as previously described. The resulting label is then itself stored, such as on a releasable liner in a wound roll, until needed.

The present invention also enables the production of multiple tester label assemblies. That is, a plurality of tester devices 15 can be aligned and mated with a plurality of base layer components, i.e., regions of thermal insulation, switch throw pads, and switch apertures, disposed upon and defined within a common base layer to form a plurality of battery tester labels 10. The resulting set of multiple label assemblies can then be stored for subsequent use, or separated into smaller groups of multiple label assemblies or into individual battery tester labels.

It will be appreciated by those skilled in the art, that a plurality of switches 65a and 65b may be provided to allow for dual calibration without utilizing any materials in the conductive circuit 18 that have a variable resistivity. Those skilled in the art will also recognize that more than two switches 65a and 65b may be provided to allow for calibration at various intermediate rates of discharge.

Although the tester circuit of the present invention has been described as being implemented in a battery label, it will be appreciated by those skilled in the art that the tester circuit may be provided on the battery packaging, on a separate tester strip, on the housing of a battery pack, or on a device that utilizes batteries.

The above description is considered that of the preferred embodiments only. Modifications of the invention will occur to those skilled in the art and to those who make or use the invention. Therefore, it is understood that the embodiments shown in the drawings and described above are merely for illustrative purposes and are not intended to limit the scope of the invention, which is defined by the following claims as interpreted according to the principles of patent law, including the Doctrine of Equivalents.

The invention claimed is:

1. A battery tester comprising:
   a heating element for generating heat in response to current supplied from a battery, said heating element having first and second end segments and a central segment disposed between said end segments, said first end segment being adapted to be coupled to a first terminal of the battery and said second end segment includes at least two switch pads for selective coupling of said second end segment to a second terminal of the battery, each of said switch pads providing a different resistivity for said heating element when pressed, to change the calibration of the tester for different discharge rates;
   an indicator provided in proximity to said heating element, said indicator having a visual property that changes in response to the heat generated by said heating element; and
   discharge rate calibration indicia associated with each of said switch pads for indicating which switch pad to press for proper calibration at a relative rate of discharge.

2. The battery tester as defined in claim 1, wherein at least a portion of said heating element is made of a variable resistivity material having a resistivity that changes in response to ambient temperature.

3. The battery tester as defined in claim 2, wherein said variable resistivity material has a resistivity that increases as ambient temperature increases.

4. The battery tester as defined in claim 1, wherein said heating element, said indicator, and said indicia are configured for inclusion in a battery label.

5. The battery tester as defined in claim 1, wherein substantially all of said heating element is made of said variable resistivity material.

6. The battery tester as defined in claim 1, wherein said heating element includes a first portion made of said variable resistivity material and a second portion made of a non-variable resistivity material.

7. The battery tester as defined in claim 1, wherein said indicator is made of a thermochromic material that changes color in response to heat generated by said heating element.

8. A battery label comprising:

a label substrate;

a conductive element provided on said label substrate and adapted to be coupled to opposite terminals of a battery, said conductive element changes temperature in response to changes in discharge level of the battery and includes a material having a resistivity that changes in response to ambient temperature; and an indicator provided on said conductive element and having a visual property that changes in response to changes in temperature of said conductive element, wherein said conductive element includes first and second switch pads provided at one end of said conductive element, said first switch pad, when pressed, couples said conductive element to one of the two battery terminals and establishes a first resistance for said conductive element, said second switch pad couples said conductive element to the same battery terminal and establishes a second resistance for said conductive element when pressed, said first resistance being a resistance required for proper calibration at a first discharge rate, and said second resistance being a resistance required for proper calibration at a second discharge rate and being higher than said first resistance.

9. The battery label as defined in claim 8, wherein said conductive element has a resistivity that increases as ambient temperature increases.

10. The battery label as defined in claim 8, wherein substantially all of said conductive element is made of a variable resistivity material.

11. The battery tester as defined in claim 8, wherein said conductive element includes a first portion made of a variable resistivity material and a second portion made of a non-variable resistivity material.

12. The battery label as defined in claim 8, wherein said indicator is made of a thermochromic material that changes color in response to heat generated by said conductive element.

13. The battery label as defined in claim 8 and further including a protective layer overlying said label substrate, said conductive element, and said indicator.

14. A method of calibrating an on-label battery tester for different battery discharge rates, the battery tester including a conductive element adapted to be coupled between opposite terminals of a battery and an indicator element proximate to the conductive element such that the indicator element changes its visual appearance in response to changes in temperature of the conductive element, the method comprising the steps of:

providing a plurality of switch contacts at one end of the conductive element for selectively altering the resistance of the conductive element, the selectable resistances of the conductive element including at least a first resistance at which the battery tester is calibrated for a relatively high discharge rate and a second resistance at which the battery tester is calibrated for a relatively low discharge rate; and selecting and pressing one of the plurality of switch contacts associated with a particular battery discharge rate.

15. A battery comprising:

an electrochemical cell having a positive terminal and a negative terminal;

a label substrate adhered to an outer peripheral surface of said electrochemical cell;

a conductive element provided on said label substrate and coupled to said terminals of said electrochemical cell, said conductive element changes temperature in response to changes in discharge level of said electrochemical cell; and an indicator provided in proximity to said conductive element, said indicator having a visual property that changes in response to the heat generated by said conductive element, wherein said conductive element includes first and second switch pads provided at one end of said conductive element, said first switch pad, when pressed, couples said conductive element to one of the two battery terminals and establishes a first resistance for said conductive element, said second switch pad couples said conductive element to the same battery terminal and establishes a second resistance for said conductive element when pressed, said first resistance being a resistance required for proper calibration at a first discharge rate, and said second resistance being a resistance required for proper calibration at a second discharge rate and being higher than said first resistance.

* * * * *